United States Patent [19]
Hamano

[11] Patent Number: 5,134,589
[45] Date of Patent: Jul. 28, 1992

[54] SEMICONDUCTOR MEMORY DEVICE HAVING A FLASH WRITE FUNCTION

[75] Inventor: Hisanori Hamano, Hyogo, Japan

[73] Assignee: Mitsubishi Denki Kabushiki Kaisha, Tokyo, Japan

[21] Appl. No.: 555,687

[22] Filed: Jul. 23, 1990

[30] Foreign Application Priority Data

Oct. 30, 1989 [JP] Japan ............................. 1-283353

[51] Int. Cl.$^5$ ............................................. G11C 13/00
[52] U.S. Cl. ............................ 365/238.5; 365/230.05; 365/218
[58] Field of Search ............. 365/238.5, 230.05, 218, 365/230.01, 230.03

[56] References Cited

U.S. PATENT DOCUMENTS 4,890,260  12/1989  Chuang et al. .................. 365/49

Primary Examiner—Terrell W. Fears
Attorney, Agent, or Firm—Lowe, Price, LeBlanc & Becker

[57] ABSTRACT

A semiconductor memory device having a flash write function includes a row decoder (2) decoding external row address for selecting one row of a memory cell array (1'), and circuitry (4, 8) responsive to a flash write designating signal for writing the same data simultaneously to the memory cells connected to the selected row. The semiconductor memory device has at least one memory block (MB1, MB2, MB, MB4), with each of the block having a plurality of column groups (B1, B2, B3, B4) each including a plurality of columns. The memory cell block has a plurality of memory cells arranged in rows and columns which can be accessed at random sequence. The memory device further includes circuitry (6) for generating the mask position designating signal at the time of flash writing, and circuitry (4-1 to 4-n, 7) for prohibiting writing of data to the column group designated by the mask position designating signal. This structure provides a semiconductor memory device which executes window processing or the like at high speed. The semiconductor memory device is a multiport random access memory for image processing.

16 Claims, 8 Drawing Sheets

SEMICONDUCTOR MEMORY DEVICE HAVING A FLASH WRITE FUNCTION

BACKGROUND OF THE INVENTION

1. Field of the Invention

The present invention relates to a semiconductor memory device and, more specifically, to an improvement of a flash write function of an image memory used as a frame buffer in the field of image processing or the like.

2. Description of the Background Art

In the field of data processing, generally the result of data processing is displayed on a CRT (Cathode Ray Tube). When a general purpose dynamic random access memory (DRAM) is used as a memory for displaying images, a CPU (Central Processing Unit) can not access to the DRAM while the images are displayed, since the DRAM is capable of only one of writing and reading of data in one cycle. Consequently, wait time of the CPU becomes longer, preventing high speed processing of data.

In view of the foregoing, a dual port RAM having a RAM port to which the CPU can access at a random sequence and a serial port (SAM port) for serially outputting image data to the CRT has come to be used as a memory for processing image information at high speed. FIG. 1 shows a schematic structure of a conventional general dual port RAM.

Referring to FIG. 1, the dual port RAM comprises a memory cell array 1 having memory cells arranged in a matrix of rows and columns, each cell storing information. Since the dual port RAM shown in FIG. 1 has a ×4 bit structure (4 bit parallel input/output), the memory cell array 1 is divided into 4 blocks MB1, MB2, MB3 and MB4.

A row decoder 2 and a column decoder 8 are provided for selecting rows and columns of the memory cell array 1, respectively. The row decoder 2 decodes an internal row address Ax applied from an address buffer 18 to select one row of the memory cell array 1. Consequently, one row is selected from each of the memory cell array blocks MB1 to MB4.

The column decoder 8 decodes an internal column address Ay from the address buffer 18 to select a corresponding column of the memory cell array 1. On this occasion, since the dual port RAM has the ×4 bit structure, one column is selected from each of the memory cell array blocks MB1 to MB4 by the output from the column decoder 8. The address buffer 18 receives externally applied address A0 to A8. Row addresses and column addresses have the externally applied address A0 to A8 applied time divisionally.

The columns of the memory cell array 1 selected by the column decoder 8 are connected to a RAM port 11. The RAM port 11 comprises an input/output buffer 110 for transferring data to and from the outside. 4 bit data W/IO1 to W/IO4 are inputted/outputted in parallel through the input/output buffer 110.

A color register 20 is provided for writing the same data in one row of memory cells selected by the row decoder 2 in the flash write mode.

A transfer gate 12, a data register 13, a serial data selector 14 and a serial port 15 are provided for serially outputting data of the memory cell array 1. The transfer gate 12 is formed of a series of transistors provided to each of the columns, which becomes conductive in an internal data transfer cycle to connect the memory cell array 1 with the data register 13. The data register 13 latches data transmitted through the transfer gate 12. The serial data selector 14 successively selects the data latched by the data register 13 in response to the address information from the address counter 16 to transmit the same to the serial port 15.

The serial port 15 comprises a serial output buffer 150. The serial output buffer 150 receives data (4 bit parallel data) selected by the serial data selector 14 and outputs the same as 4 bit serial data SO1 to SO4 in parallel.

The address counter 16 latches the column address Ay applied from the address buffer 18 and designates bit position of the data register 13 which is to be read at first from the serial data selector 14. Thereafter, the address is successively incremented in the address counter 16 in response to a clock signal SC.

The transfer gate 12, the data register 13 and the serial data selector 14 are respectively divided into four blocks corresponding to the memory cell array blocks MB1 to MB4, and they operate on a block basis, respectively. More specifically, the transfer gate 12 comprises transfer gate blocks 12-1 to 12-4; the data register 13 comprises data register blocks 13-1 to 13-4; and the serial data selector 14 comprises serial data selector blocks 14-1 to 14-4.

A timing generation circuit 19 is provided for generating control clocks defining various operation timings of the dual port RAM. The timing generating circuit 19 receives a row address strobe signal $\overline{RAS}$ applying a timing for taking row addresses, a column address strobe signal $\overline{CAS}$ applying a timing to take column addresses, a signal $\overline{DT/OE}$ activating data output in the RAM port and defining internal data transfer cycle, a signal $\overline{WB/WE}$ activating data writing in the RAM port and designating write per bit mode, and a signal $\overline{F}$ designating flash writing. Addresses A0 to A8 for refreshing are generated for designating row addresses for refreshing in the memory cell array 1 are generated from the timing generating circuit 19, which addresses are transmitted to the row decoder 2 through the address buffer 18.

A serial enable signal $\overline{SOE}$ for activating the serial port 15 is applied to the serial port 15. The operation will be briefly described in the following.

For example, a CPU accesses the memory cell array 1 through the RAM port 11, in the same manner as to a common DRAM. Writing/reading of data in the RAM port 11 is determined by the signals $\overline{DT/OE}$ and $\overline{WB/WE}$. If the signal $\overline{DT/OE}$ is active, it is in the data output mode, and if the signal $\overline{WB/WE}$ is active, it is in the data writing mode.

Data transfer from the memory cell array 1 to the data register 13 is carried out by using the controlling signal $\overline{DT/OE}$. If the signal $\overline{DT/OE}$ is "L" at the falling edge of the signal $\overline{RAS}$ changing to "L", the memory cell data of the row designated by the row address Ax taken at the falling edge of this signal $\overline{RAS}$ are transferred to the data register 13 through the transfer gate 12. The address counter 16 latches the column address Ay taken at the falling edge of the signal $\overline{CAS}$ and transmits the same to the serial data selector 14. The serial data selector 14 selects the data of the bit position corresponding to the column address from the address counter 16 from the data register 13 to transmit the same to the serial output buffer 150. The data output of the serial data selector 14 is done after the signal $\overline{DT/OE}$ has risen to complete internal data transfer. The address in the address counter 16 is successively incremented in response to the clock signal SC. Consequently, data are serially outputted from each of the blocks of the data register 13.

The write per bit operation will be described briefly. In the field of graphic processing or the like, it is sometimes necessary for the CPU to rewrite data on a bit basis in the memory. For example, if 4 bit data outputted from the serial port correspond to color signals R (red), G (green) and B (blue), sometimes only one of these colors is desired to be changed. In such a case, the write per bit operation is carried out to rewrite the desired color data only. In the write per bit operation, the signal $\overline{WB/WE}$ is set to "L" when the signal $\overline{RAS}$ falls. At this timing, only the data input terminal Wi to which "H" is applied becomes the write enable state. Thereafter, the signal $\overline{WB/WE}$ rises to "H" and the signal $\overline{CAS}$ falls and thereafter the signal $\overline{WB/WE}$ falls, whereby data are written only to the input terminal to which writing is enabled at the said timing.

When data of memory cells of one row are to be erased in the field of data processing, high speed erasure becomes possible by writing the same data to the selected row at one time. Such operation cycle is called a flash write operation. The data written to the selected row at this time are written to the color register 20. The flash write operation will be described in more detail in the following.

The path of data writing from the RAM port of 1 bit is schematically shown in FIG. 2. Referring to FIG. 2, a control gate 4 is provided between an internal data transmitting line 50 for transmitting write data Din and the memory cell array 1'. The control gate 4 comprises transistor switches Tr1 to Trn provided corresponding to respective columns of the memory cell array 1. The control gate 4 becomes conductive in response to the internal writing control signal $\overline{WR}$. The internal writing control signal $\overline{WR}$ is generated from the timing generating circuit 19 shown in FIG. 1 in response to the write enable signal $\overline{WB/WE}$. A sense amplifier 3 for detecting and amplifying data of the selected memory cell out of the memory cell array 1' is provided between the column decoder 8 and the memory cell array 1. The column decoder 8 receives the internal flash write designating signal $\overline{F}$ as an operation controlling signal. If the internal flash write designating signal $\overline{F}$ is active "L", the column decoder 8 sets all the outputs thereof to active "H", and connects all columns of the memory cell array 1 to the control gate 4. If the internal flash write designating signal $\overline{F}$ is inactive "H", it decodes the internal column address Ay in response to a prescribed timing (applied from the signal $\overline{CAS}$) and selects a corresponding column from the memory cell array 1 to connect the same to the control gate 4.

In the flash write mode, the data Din transmitted to the internal write data transmitting line 50 are transmitted from the color register 20. The flash write operation will be described in the following with reference to the signal waveforms of FIG. 3.

Designation of the flash write operation is done by setting the write controlling signal $\overline{WR}$ ($\overline{WB/WE}$) and the flash write enable signal $\overline{F}$ both to "L" at the falling edge of the signal $\overline{RAS}$. Consequently, the color register 20 is activated, and the data applied to the RAM port 11 (see FIG. 1) are written to the color register 20 as the data for flash writing. At this time, the external address An (A0 to A8) taken to the address buffer 18 at the falling edge of the signal $\overline{RAS}$ is transmitted to the row decoder 2 as the row address Ax. Thereafter, the internal row address Ax is decoded by the row decoder 2, and one row of the memory cell array 1 is selected.

Meanwhile, when the write control signal $\overline{WR}$ becomes active "L", the switching transistors Tr1 to Trn of the control gate 4 all become conductive. Thereafter, when the signal $\overline{CAS}$ falls to "L", generally the internal column address Ay is decoded by the column decoder 8. However, in this mode, since the internal flash write designating signal $\overline{F}$ is active "L", the column decoder 8 set all outputs thereof to "H". Consequently, all the columns of the memory cell array 1 are connected to the internal data transmitting line 50 through the conductive control gate 4. The data are transmitted from the color register 20 to the internal data transmitting line 50 in response to the signal $\overline{CAS}$, and the write data Din are written to all the memory cells of the selected row.

By the above described structure, it becomes possible to write data to one row of memory cells (for example 512 bits, or 2048 bits in a RAM having 1M bit capacity of $\times 4$ bit structure) at one time by one operation cycle, which enables clearing of the display screen at high speed.

By using a conventional flash write function, it is possible to clear the screen at high speed and it is also possible to rewrite data only of desired rows with respect to the vertical direction on a display screen.

Meanwhile, in the field of image processing, sometimes it becomes necessary to rewrite data of only a specified area with respect to the horizontal direction of the screen, such as in the case of window erasure in which a window area on the screen is erased or rewritten. Generally, respective bits of the memory correspond to respective dots on the screen such that one row of the dual port RAM corresponds to one horizontal scanning line on the screen. Therefore, when the flash write function described above is used, all memory cell data of one row are rewritten at one time, and accordingly, it is impossible to selectively rewrite data at a specified area in the horizontal direction.

General description of the flash write function is disclosed in pp. 123 to 129 of NIKKEI ELECTRONICS (No. 431) published on Oct. 5, 1987.

This reference discloses a block write function wherein one block of 4 rows and 4 columns (for $\times 4$ bit memory) or 8 rows and 4 columns (for $\times 8$ bit memory) is selected to have data written thereinto. In the block write mode, at the falling edge of the signal $\overline{RAS}$, a row address applied at address pins is taken into the memory to be decoded for selecting 4 rows (for $\times 4$ bit memory). At the same time, data at data input/output pins are taken into the memory to define a bit or bits to be masked of the color register. Then a column address excluding the least significant bit is taken into the memory for selecting one column block of 4 bits at the falling edge of the signal $\overline{CAS}$. At the same time, data at data input/output pins is taken into to define a column to be masked in the column block. Therefore, according to the block write mode, one block of $4 \times 4$ bits or $8 \times 4$ bits are subjected to data writing in one $\overline{RAS}$ cycle. This block write mode enables clear of the display screen on a block basis, but only 4 bits on a row can be accessed at a time.

SUMMARY OF THE INVENTION

One object of the present invention is to provide an improved semiconductor memory device eliminating the above described drawbacks of the conventional dual port RAM.

Another object of the present invention is to provide a multiport RAM which can selectively rewrite data of an arbitrary area of one row of multiport RAM corresponding to horizontal scanning line on a display screen at high speed.

Briefly stated, the semiconductor memory device in accordance with the present invention comprises a memory area with each row divided into a plurality of groups by a plurality of columns by columns, and a masking function for selectively writing data only to an arbitrary column group on a row selected by a row address signal in flash write operation.

More specifically, the semiconductor memory device in accordance with the present invention comprises a plurality of memory cell groups each consisting of a plurality of columns, writing means for writing the same data simultaneously to the memory cells connected to the row selected by a row address, and means for controlling the operation of the writing means in response to a mask position designating signal such that writing of data to the memory cell group defined by the mask position designating signal is prohibited.

The mask position designating signal is produced by a column address taken into the device in response to the control signal $\overline{CAS}$.

The method of data writing in accordance with the present invention comprises, in a semiconductor memory device in which each row is divided into groups by a plurality of columns by columns, the steps of specifying a memory group, data writing to which is to be prohibited, in response to a mask position designating signal, and writing simultaneously the same data to the memory cells of the row selected by a row address signal except the group to which writing is prohibited, in response to a flash write designating signal.

According to the above described structure, it becomes possible to make a prescribed memory cell group masked for data writing in the flash write operation, whereby data can be written at one time only to the desired memory cell groups out of the memory cells of one row, enabling selective data writing operation such as window erasure at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
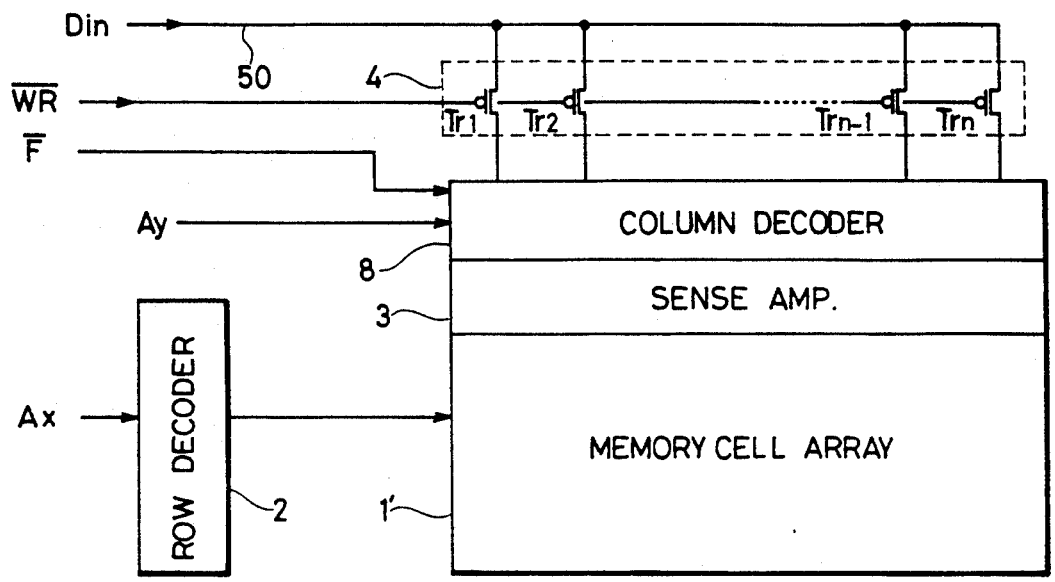
FIG. 2 schematically shows only the circuit structure related to writing of 1 bit data in the dual port RAM shown in FIG. 1.
Figure 3:
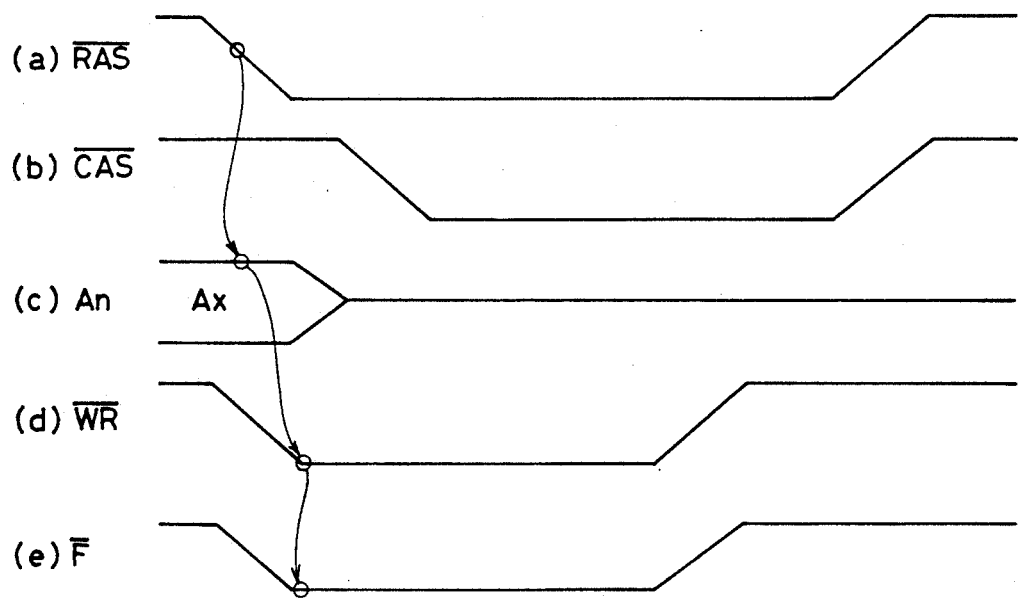
FIG. 3 is a diagram of signal waveforms showing the flash write operation in a conventional semiconductor memory device.
Figure 4:
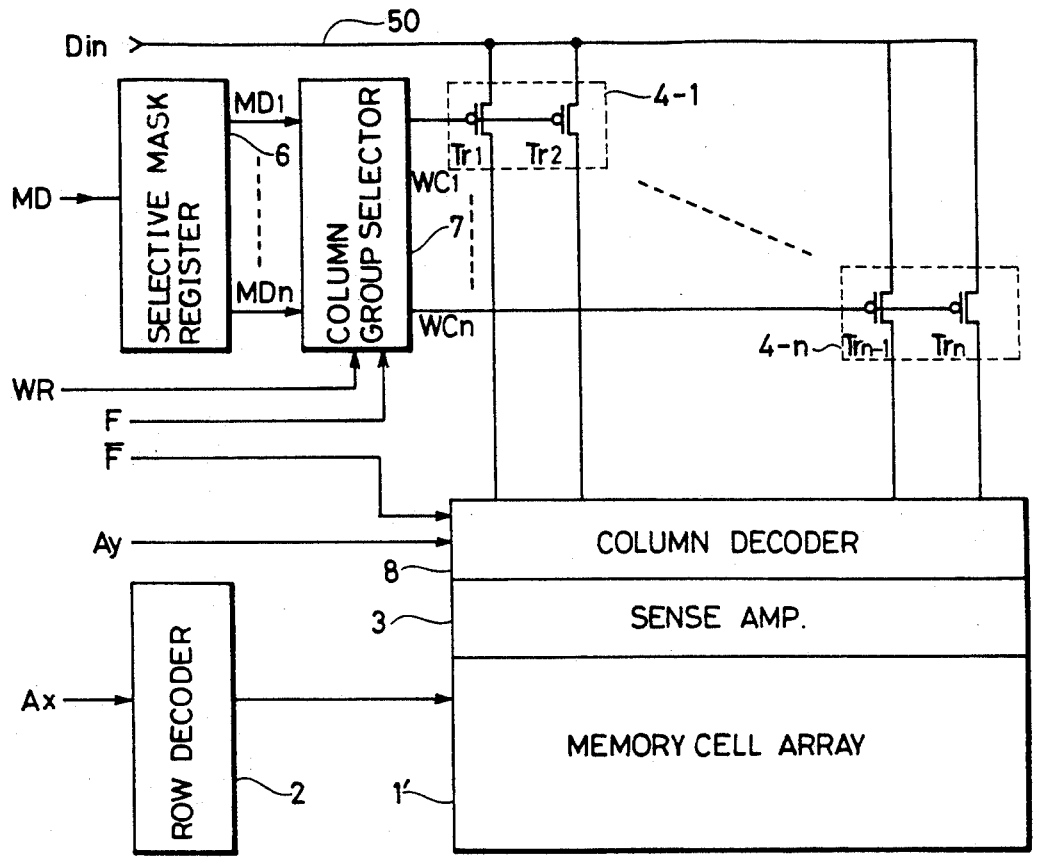
FIG. 4 shows a structure of a main portion of the semiconductor memory device in accordance with one embodiment of the present invention.

FIG. 4 shows a schematic structure of a semiconductor memory device in accordance with one embodiment of the present invention. In the structure shown in FIG. 4, only the circuit structure related to writing of 1 bit data is shown, and portions corresponding to those shown in FIG. 2 are denoted by the same reference characters.

Referring to FIG. 4, the control gate 4 is divided in n groups 4-1 to 4-n. As the control gate 4 is divided into groups, the columns of the memory cell array 1' are also divided into n groups.

Figure 1:
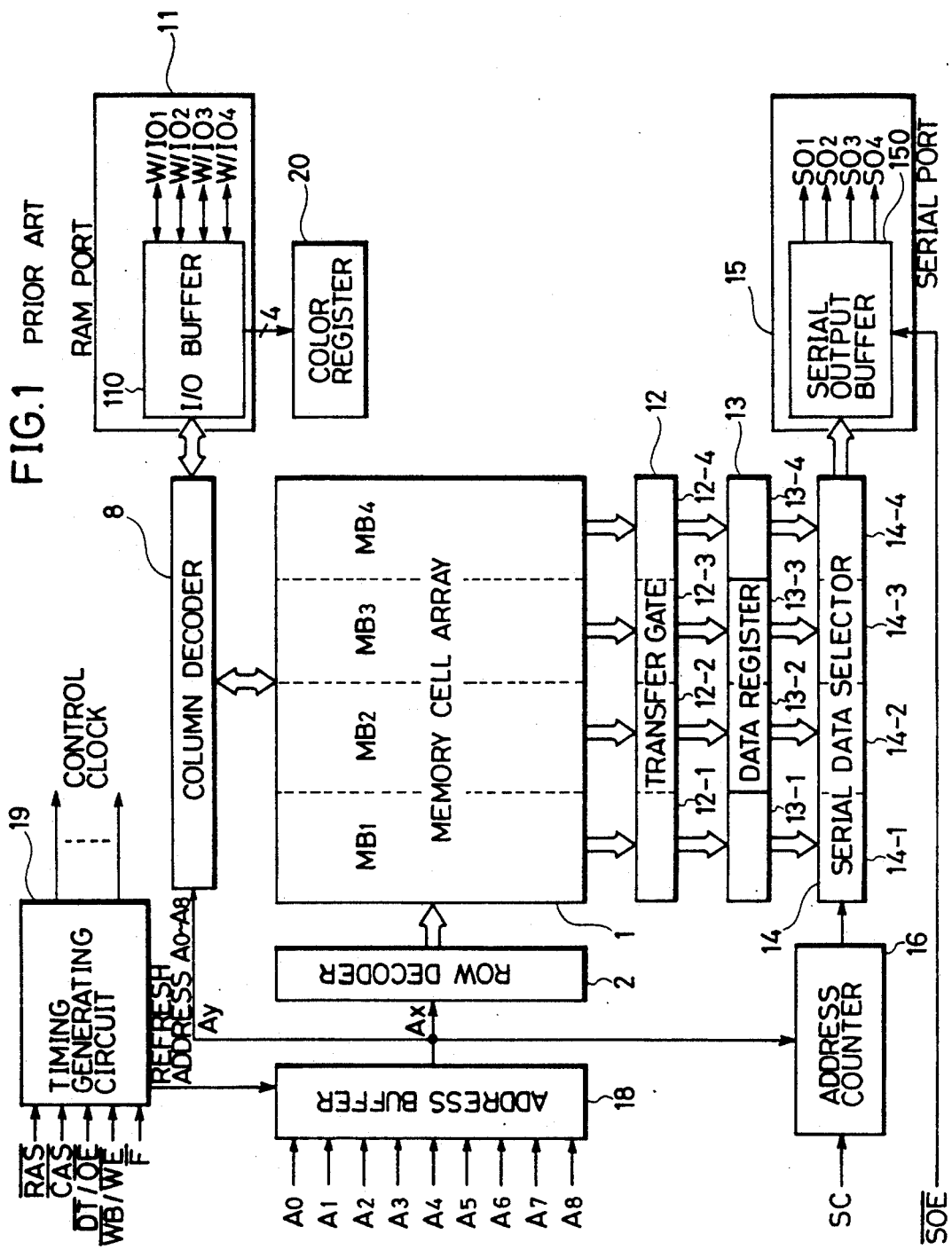
FIG. 1 schematically shows the whole structure of a conventional dual port RAM.

A selective mask register 6 and a column group selector 7 are provided for selecting any of the control gate groups 4-1 to 4-n. The selective mask register 6 latches an externally applied mask data MD and designates a column group which is to be masked. The column address Ay applied through an address buffer 18 similar to the buffer 18 shown in FIG. 1 is used as the mask data MD. Consequently, it becomes possible to write mask group designating data without newly providing an external pin for setting the mask data.

Figure 5:
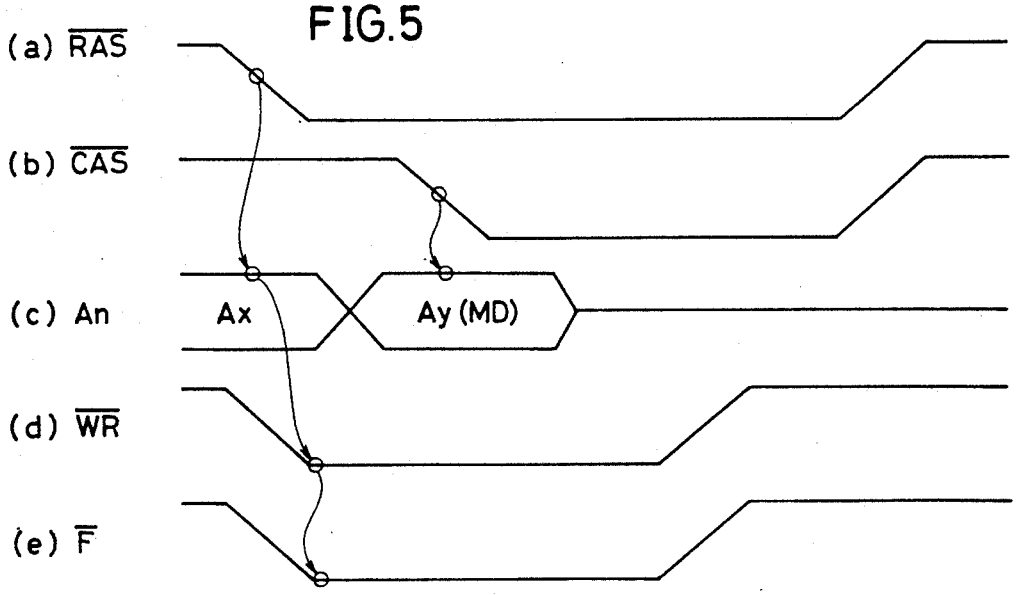
FIG. 5 is a diagram of signal waveforms showing the operation of the semiconductor memory device in accordance with one embodiment of the present invention.

The column group selector 7 selectively makes the control gate groups 4-1 to 4-n conductive in response to the mask data MDi of the selective mask register 6. When the internal flash write designating signal $\overline{F}$ is active, that is, when the complementary internal flash write designating signal F is "H", the column group selector 7 makes all the control gate groups 4-1 to 4-n conductive in response to the internal write control designating signal $\overline{WR}$. The flash write operation of the semiconductor memory device in accordance with one embodiment of the present invention will be described with reference to the diagram of waveforms of FIG. 5.

The flash writing is set by setting the write control signal $\overline{WR}$ (the signal $\overline{WB}/\overline{WE}$ of FIG. 1) and the internal flash write designating signal $\overline{F}$ to "L" at the falling edge of the signal $\overline{RAS}$. Consequently, the data which are to be written to a color register similar to the register 20 shown in FIG. 1 are latched in the same manner as in the prior art, and the externally applied row address An is decoded as the row address Ax by the row decoder 2, so that a corresponding row of the memory cell array 1' is selected.

Thereafter, at the falling edge of the signal $\overline{CAS}$ falling to "L", the column address Ay is taken in the device to be applied to the column decoder 8 and to the selective mask register 6. The selective mask register 6 takes in and latches the applied column address Ay as the mask data MD and applies the same to the column group selector 7 as the write mask data MDi. The respective bits of the column address Ay correspond to the mask data. Therefore, the memory cell array is divided into as many groups as the column address bits.

Since the flash write designating signal $\overline{F}$ is active "L" at this time, the column decoder 8 sets all columns to the selected state, regardless of the applied column address Ay. Since the internal write designating signal $\overline{WR}$ is active "L" and the flash write designating signal $\overline{F}$ is active, the column group selector 7 sets off only the control gate group 4-i corresponding to the mask data MDi from the selective mask register 6 and sets other groups conductive. Consequently, the column groups of the memory cell array 1' which are not masked are connected to the internal write data transmitting line 50 through the control gate groups which are on. The write data Din (applied from the color register 20) are written to the memory cells included in the column groups which are not masked out of the memory cells connected to the selected row.

In a general bit by bit data writing operation, the flash write designating signal $\overline{F}$ is inactive, so that the column group selector 7 transmits the write control designating signal $\overline{WR}$ to the respective control gate groups 4-1 to 4-n as the control signal WCi, regardless of the mask data $\overline{MDi}$ from the selective mask register 6. Consequently, all the control gate groups 4-1 to 4-n are made conductive, enabling bit by bit data writing in the similar manner as in the prior art.

Figure 6:
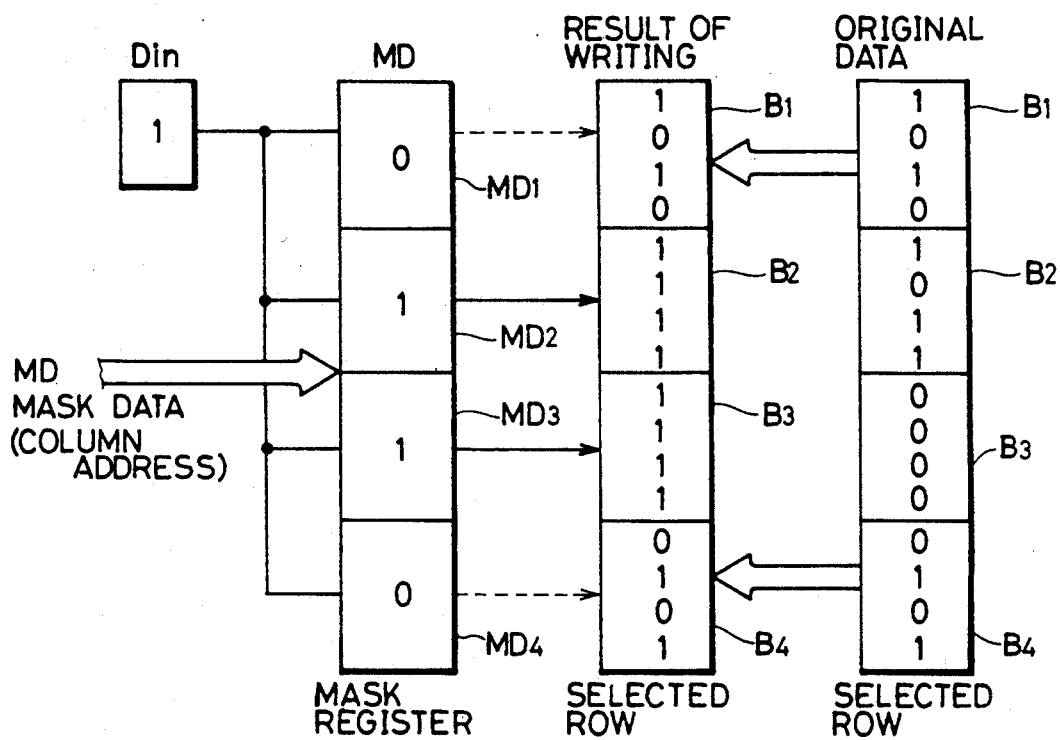
FIG. 6 schematically shows the operation of the semiconductor memory device in accordance with the present invention.

The flash write operation with masking is schematically shown in FIG. 6. Referring to FIG. 6, one example is shown in which data writing is masked when the mask data MDi is "0". The control gate group is divided into four groups, and data in each group are shown consisting of 4 bits, as an example.

Referring to FIG. 6, the mask data MD1 and MD4 are "0", and the column groups B1 and B4 of the memory cell array are masked for flash writing. If the write data Din is "1" in this state, the data in the memory cell groups B2 and B3 are all set to "1", so that data writing is carried out to these groups at one time. The data of the memory cell groups B1 and B4 are the same as the original data.

By providing the above described structure, it becomes possible to write data only to a desired memory cell group out of memory cells of one row.

Figure 7:
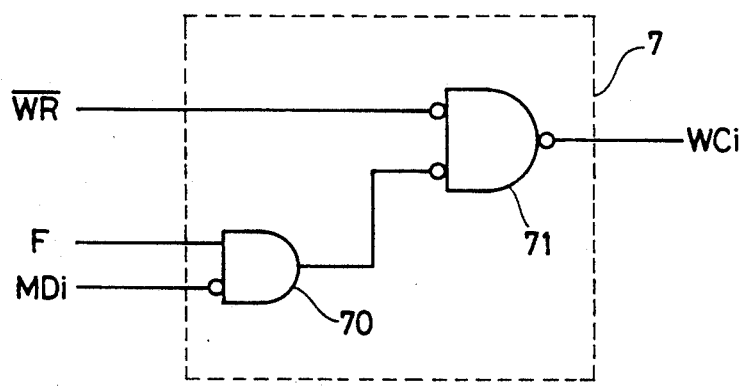
FIG. 7 shows one example of a specific structure of a column group selector shown in FIG. 4.

FIG. 7 shows one example of a specific structure of the column group selector. In the structure shown in FIG. 7, only a circuit structure generating one control signal WCi is shown as a representative. Referring to FIG. 7, the column group selector 7 comprises a gate circuit 70 receiving a complementary flash write designating signal F and the mask data MDi, and a gate circuit 71 receiving the output from the gate circuit 70 and the write control designating signal $\overline{WR}$. The control signal WCi is outputted from the gate circuit 71. The gate circuit 70 outputs a "H" signal when the complementary flash write designating signal F is "H" and the mask data MDi is "L" (0). The gate circuit 71 outputs a "L" signal only when the output of the gate circuit 70 is "L" and the write control signal $\overline{WR}$ is "L". The operation will be briefly described.

Let us assume that the complementary flash write designating signal F is at the "H" level, designating flash writing. In that case, the gate circuit 70 functions as an inverter, and it outputs an inverted signal of the mask data MDi. When the write control signal $\overline{WR}$ attains to "L", the gate circuit 71 passes the signal, as it is, received from the gate circuit 70. Namely, if the mask data MDi is "0", the control signal WCi becomes "H" (1), so that the corresponding control gate 4-i is turned off. Meanwhile, if the mask data MDi is "1" ("H"), the corresponding control gate group 4i becomes conductive.

If the flash write designating signal F is "L", the output of the gate circuit 70 attains to "L" regardless of the mask data MDi. Therefore, if the write control signal $\overline{WR}$ attains to "L", the control signal WCi attains to "L", and consequently, all the control gate groups 4-i become conductive regardless of the mask data MDi.

If the write control signal $\overline{WR}$ is "H", the output of the gate circuit 71 attains to "H" regardless of the output from the gate circuit 70, and accordingly, the control gate groups 4-1 are all off.

Figure 8:
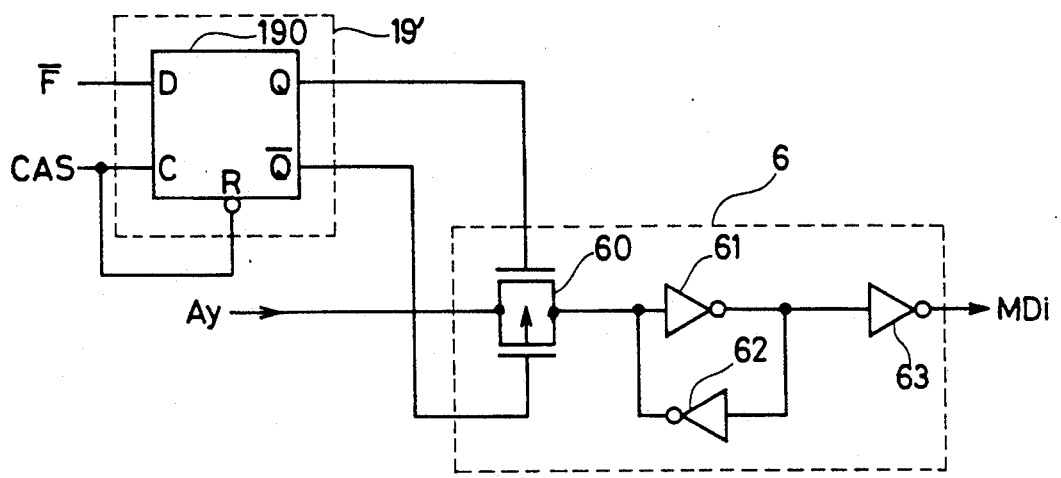
FIG. 8 shows one example of a specific structure of a selective mask register 6 shown in FIG. 4.

One example of a specific structure of the selective mask register 6 is shown in FIG. 8. Only a structure corresponding to 1 bit mask data is shown in FIG. 8.

Referring to FIG. 8, the selective mask register 6 comprises a transmission gate 60 responsive to a data taking designating signal from a controlling circuit 19' for transmitting the column address Ay, an inverter 61 for inverting the output of the transmission gate 60, an inverter 62 inverting the output of the inverter 61 for feeding the same back to the input portion of the inverter 61, and an inverter 63 inverting the output of the inverter 61 for outputting the mask data MDi. The inverters 61 and 62 constitute an inverter latch, which latches the data transmitted through the transmission gate 60.

Figure 9:
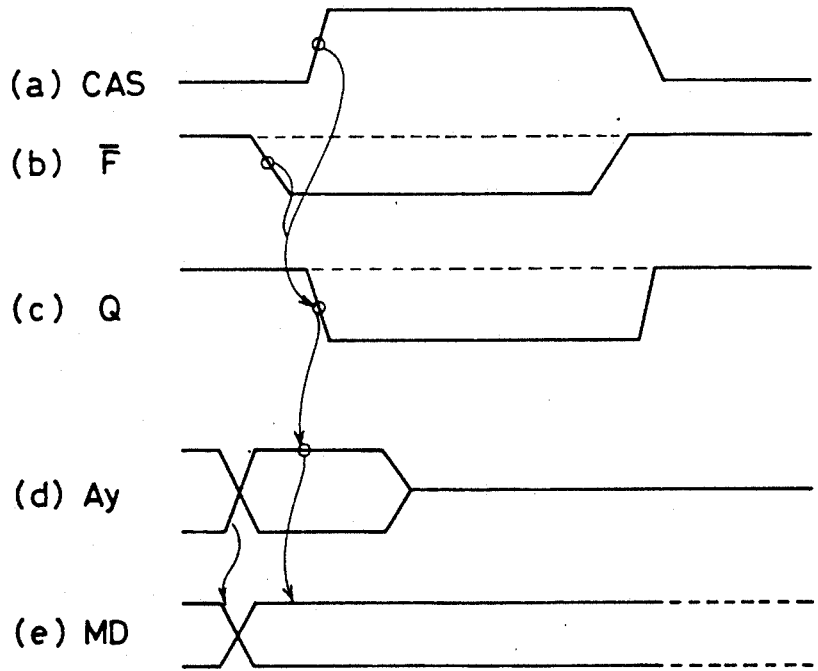
FIG. 9 is a diagram of signal waveforms showing the operation of the circuit shown in FIG. 8.

A D-flip.flop 190 is provided for controlling the operation of the transmission gate 60. The D-flip.flop 190 may be included in the timing generating circuit 19 shown in FIG. 1, or it may be included in the selective mask register 6. The D-flip.flop 190 comprises a clock input C receiving the complementary internal column address strobe signal CAS, a D input receiving the internal flash write designating signal $\overline{F}$, and outputs Q and $\overline{Q}$. The complementary internal column address strobe signal CAS is also transmitted to a reset input R of the D-flip.flop 190. The operation will be briefly described with reference to the diagram of waveforms shown in FIG. 9.

Designation of a flash writing is done by setting the signal $\overline{F}$ to "L" at the falling edge of the signal $\overline{RAS}$ as described above. The D-flip.flop 190 takes in the signal applied to the D input at the rising edge of the signal applied to the clock input C, outputs the signal from the output Q and outputs the inverted signal from the output $\overline{Q}$. Therefore, when the signal CAS rises to "H", the output Q will be "L" and the output $\overline{Q}$ will be "H". Consequently, the transmission gate 60 becomes non-conductive, so that currently applied column address Ay is latched as the mask data MDi in the selective mask register 6.

Meanwhile, if the flash write designating signal $\overline{F}$ is "H" at that time, the output Q of the D-flip.flop 190 is "H" and the transmission gate 60 is kept on, to pass through applied signal, and the mask data is made unstable.

In the structure shown in FIG. 8, when the internal controlling signal CAS falls to "L" and one CAS cycle is completed, the D-flip.flop 190 is reset and the transmission gate 60 is set on.

A reset circuit for resetting latch data in response to the control signal $\overline{CAS}$ or $\overline{RAS}$ (which circuit can be readily realized by providing a switching transistor connected to the ground) may be provided in the selective mask register 6 in the structure shown in FIG. 8.

Figure 10:
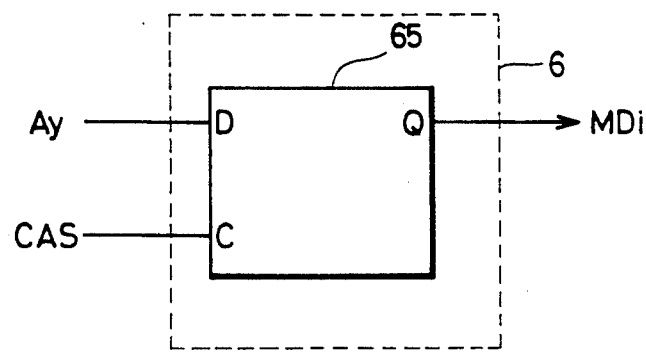
FIG. 10 shows another example of the structure of the selective mask register shown in FIG. 4.
Figure 11:
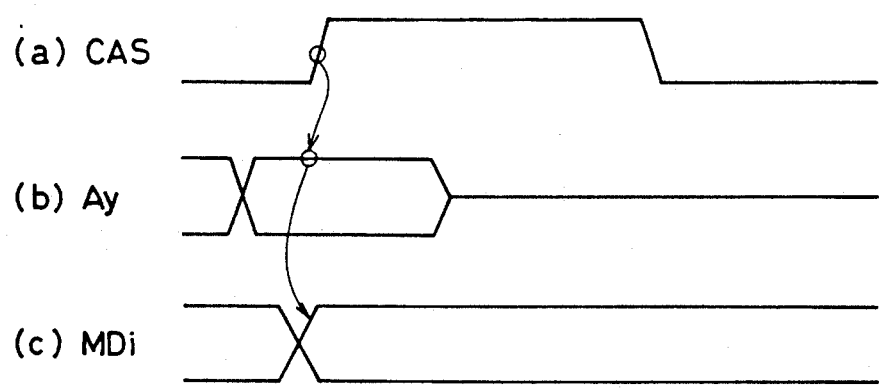
FIG. 11 illustrates the operating waveform diagram of the circuit shown in FIG. 10.

In the structure shown in FIG. 8, the on/off of the transmission gate 60 is controlled by a control signal from the control timing signal generating circuit 19' to apply timing for taking in the mask data. Alternatively, one D-flip.flop 65 may be used as the mask register 6, as shown in FIG. 10. In that case, as shown in FIG. 11, the column address Ay is latched through the D input to be outputted as the mask data MDi every time the internal column address strobe signal CAS rises to "H". In the structure of FIG. 10, the D-flip.flop 65 may be reset by the controlling signal CAS or RAS.

Figure 12:
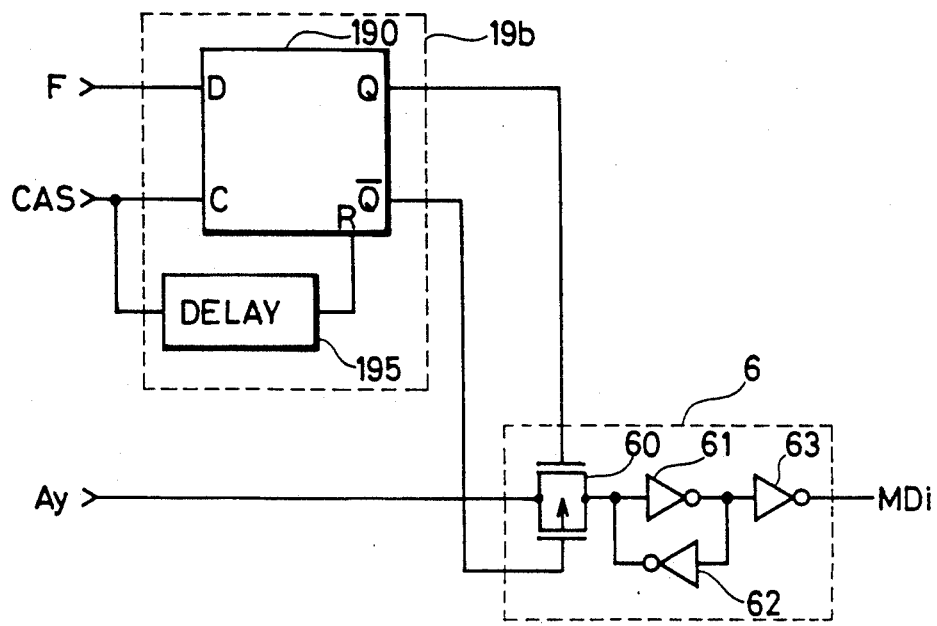
FIG. 12 shows a modification of the circuit shown in FIG. 8.
Figure 13:
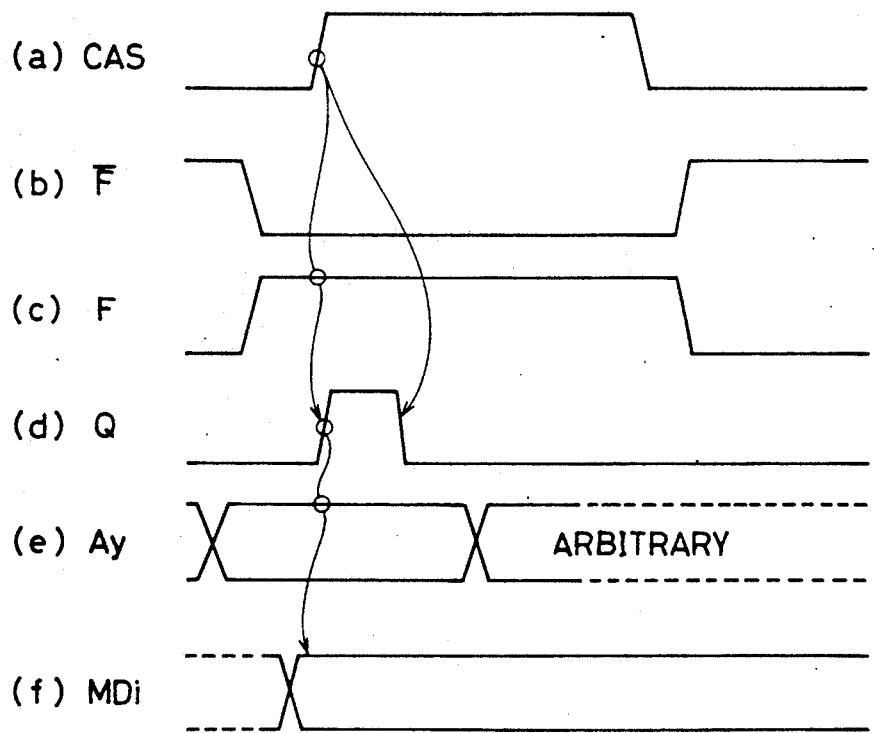
FIG. 13 shows an operating waveform diagram of the circuit shown in FIG. 13.

FIG. 12 shows modification of the circuit shown in FIG. 8. Referring to FIG. 12, a control signal generator 19b corresponds to the generator 19' and includes D flip.flip 190 and a delay circuit 195. D flip.flop 190 receives at D input the signal F instead of the signal $\overline{F}$, and at C (clock) input the signal CAS. The delay circuit 195 receives the signal CAS to delay the same by a predetermined time for application to R (reset) input of D flip.flip 190. Other components are the same as those shown in FIG. 8. Now, operation will be described with reference to FIG. 13, which is an operational waveform diagram of the circuit in FIG. 12.

Before rising of the signal CAS, the signal F is set high ("H"). At the rising edge of the signal CAS, D flip.flop 190 takes in the signal F at D input for latching and outputting. Q output of D flip.flop 190 becomes high to turn on the gate 60. The gate 60 thus turned on passes through the current column address Ay to the latch (inverters 61, 62 and 63). The output of the circuit 6 is applied to the selector 7 as a mask data MDi.

When a predetermined time has elapsed after the rising of the signal CAS, the output of the delay circuit 195 rises to reset D flip.flop 190. Then Q output of D flip.flop falls to low ("L") to turn off the gate 60. The circuit 6 maintains the output data (or mask data) MDi by its latching function independent of the address Ay.

Figure 14:
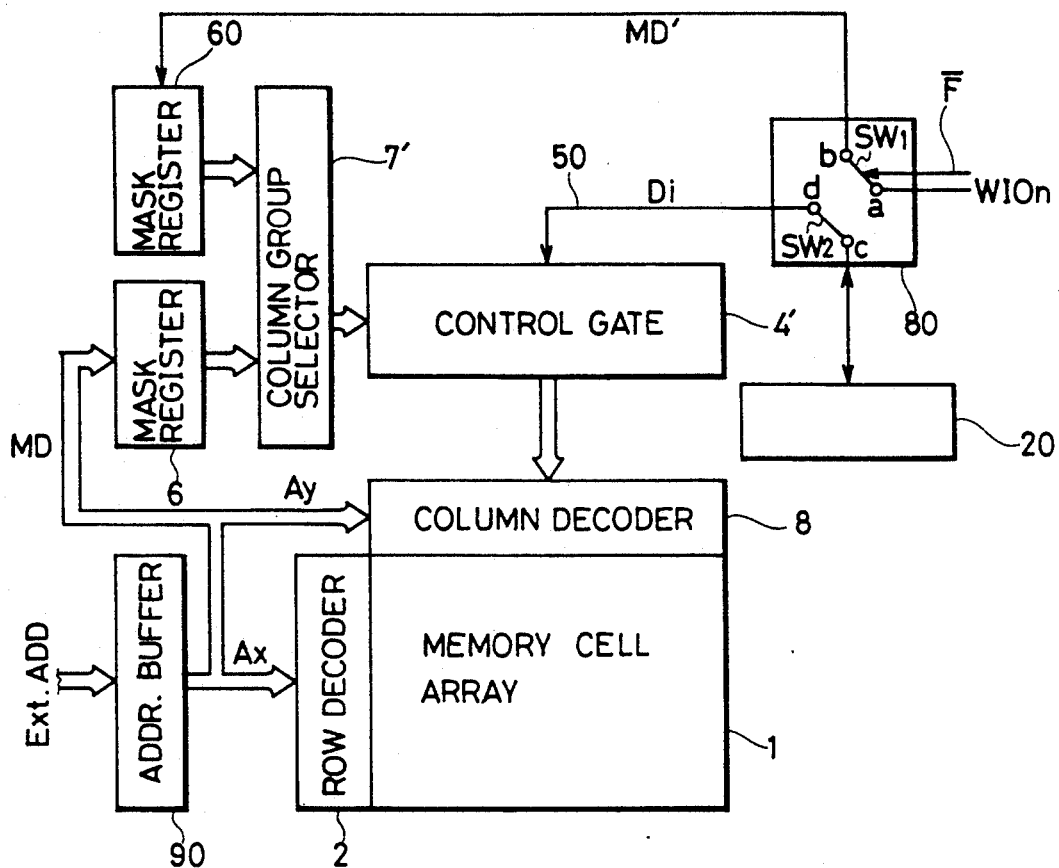
FIG. 14 shows a memory device according to another embodiment of the present invention.

In the memory shown in FIG. 4, only column address bits are employed for the mask data. In this structure, the memory array 1 can be grouped into as many blocks as column address bits, along the row direction. The number of the blocks can be increased if the structure shown in FIG. 14 is employed. In flash write, the data input/output pins at random port is not employed. Then, the RAM data input/output pins WIn (n; integer) are employed for applying mask data MD'.

Referring to FIG. 14, the memory device includes a multiplexing circuit 80, and additional mask data register 60. The multiplexing circuit 80 contains a switching element SW1 for connecting the node, a, to the node, b, in response to the signal $\overline{F}$, and a switching element SW2 for connecting the node, c, to the node, d. In other words, the multiplexer 80 transfers the data at the pin WIOn as additional mask data MD', and transfers data from the color register 20 through the signal line 50 to the control gate 4' as flash write data. For the switching elements SW1 and SW2, any transistors or gates may be employed.

The additional mask data register 60 has the same structure as that of the register 6.

The column group selector 7' receives the mask data MD and MD' from the registers 6 and 60 to control the control gate 4'. The control gate 4' is grouped into blocks, one for each bit of mask data MD and MD'.

If the memory has ×4 bit configuration, 4 random data input/output terminals is provided for WIn. The control gate 4' and the memory cell array are grouped into as many blocks as the number of column address bits and data bits.

Figure 15:
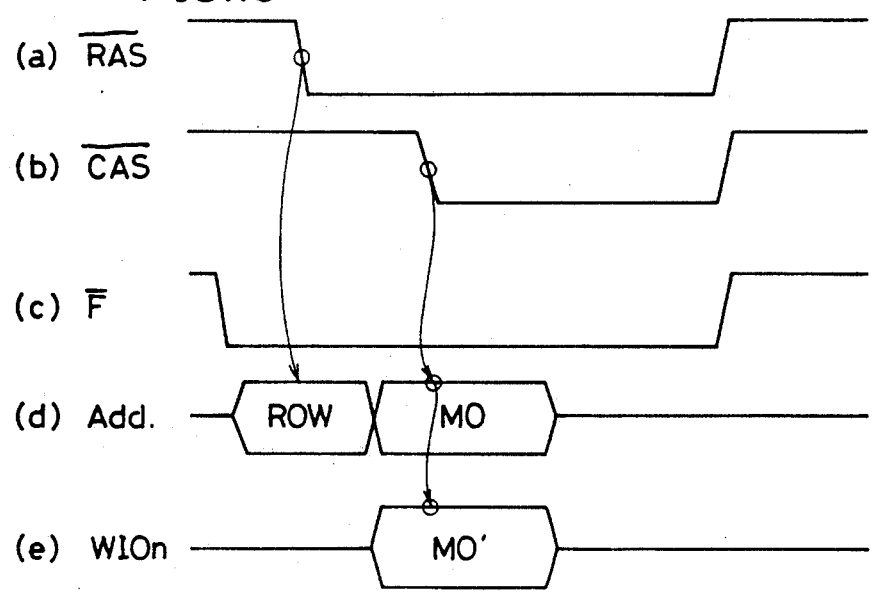
FIG. 15 shows an operating waveform diagram of the memory device as shown in FIG. 16.

An address buffer 90 receives row address and column address in time division multiplexing manner. Now operation will be described with reference to FIG. 15.

In the flash mode, the signal $\overline{F}$ is set low, and the switching element SW1 couples the data at the pin WIn to the register 60 while the switching element SW2 couples the color register 20 to the signal line 50.

When the signal $\overline{RAS}$ falls "L", the address buffer 90 takes in currently applied address as row address Ax for application to the row decoder 2. The row decoder 2 decodes the applied address Ax to select corresponding row in the memory cell array 1 for the flash writing.

At the falling edge of the signal $\overline{CAS}$, the address buffer 90 takes in applied address for application to the mask data register 6 as well as the column decoder 8. The mask data register 6 receives applied data in response to the falling of the signal CAS to latch and output to the selector 7' as mask data 7'.

The additional mask data register 60 also takes in the applied data for latching and application to the selector 7' as additional mask data MD, in response to the fall of the signal $\overline{CAS}$.

The column decoder 8 receives the column address Ay from the address buffer 90, but it neglects the address Ay to connect all columns to the control gate 4', in response to the signal $\overline{F}$ at "L".

The selector 7' selectively turns on the transistor switches of the control gate 4' according to applied mask data bits. Then, data on the signal line 50 is simultaneously written into the memory cells connected to the selected row excluding the columns which are prohibited from data writing by the mask data MD and MD'.

In the structure shown in FIG. 14, mask data MD and MD' are both employed. However, one of the mask data MD and MD' may be employed for masking the data writing to a particular block or blocks of columns. In this scheme, if multiplexer is provided between the column group selector and the control gate 4', the memory cell array 1, or the control gate 4' can be provided with these different grouping of columns; one for the mask data MD, the other for the mask data MD', and another for the combination of mask data MD and MD'.

The circuit structures shown in FIGS. 7, 8, 10 and 12 are mere examples, and the polarity of the gate circuit may be changed when the polarity of the signals are changed.

In the above described embodiment, the control gate 4 becomes conductive when the write control signal $\overline{WR}$ is "L", and the switching transistors Tr1 to Trn are formed of p channel MOS (insulated gate type) transistors. By changing the polarity of the controlling signal $\overline{WR}$, the control gate 4 may be formed by n MOS transistors.

In the above described embodiment, the control gate 4 becomes conductive/non-conductive in response to the write control signal $\overline{WR}$, and the memory cell array 1' is selectively connected to the internal write data transmitting line 50. However, if the internal data transmitting line 50 is used for transmitting both writing data and reading data, a write/read designating signal or a signal provided by delaying the controlling signal CAS which is generally used in a DRAM may be used instead of the write control designating signal $\overline{WR}$ for controlling the control gate 4.

A structure for writing data in a prescribed area of the memory cell array 1' corresponding to 1 bit is shown in the above described embodiment. However, in a ×4 bit structure such as shown in FIG. 1, it is possible to provide a structure prohibiting the flash write operation only to a desired bit (memory block) thereof. Such a structure can be readily realized by using a signal applied to the input terminal of the RAM port at the time of generation of the flash write designating signal as a control signal for activating/inactivating the column group selector 7 of each memory block as a mask bit, as in the write per bit operation.

Although a dual port RAM having the ×4 bit structure has been described as an example in the foregoing, the same effect as in the above described embodiments can be provided even if a dualport RAM has a configuration other than ×4 configuration such as by 8 and by 16, and in addition the serial port has a structure which is also capable of serial data input. The same effect as described above can be provided even by a general purpose DRAM, by providing a control gate between the memory cell array and the internal data transmitting line.

The memory device is not limited to DRAM, and the same effect as described above can be obtained by a memory device having a mode such as a page erasure mode, in which data of memory cells of one row are erased at one time.

As described above, according to the present invention, in a memory device having a function of rewriting data of memory cells of one row at one time, any group of memory cells of the one row can be masked for the writing at one time, whereby flexible image processing, such as data processing including window erasure in which only a desired area on the screen can be erased, can be readily carried out at high speed in the field of image processing.

Since the column address is used as the mask data, the mask data can be written without newly providing an external pin, so that a semiconductor memory device having high performance can be realized while maintaining compatibility with conventional memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a flash write function for writing the same data into memory on a selected row, comprising:

a memory cell array having a plurality of memory cells arranged in a matrix of rows and columns, each row divided into groups of columns;

row selecting means responsive to an externally applied row address for selecting a row of said memory cell array;

means responsive to a signal indicating the flash write function for writing the same data simultaneously to the memory cells of the row selected by said row selecting means; and means responsive to a column group designating signal as a mask position designating signal for controlling said means for writing the same data such that writing of the same data is prohibited to only the memory cells designated by said column group designating signal.

2. A semiconductor memory device according to claim 1, wherein said means for controlling said means for writing the same data comprises means receiving an externally applied column address signal for generating said mask position designating signal.

3. A semiconductor memory device having a flash write function for writing the same data to memory cells on a selected row, comprising:

a memory cell block, said memory cell block having a plurality of memory cells arranged in a matrix of rows and columns and being accessible at random;

a data transmitting line for transmitting write data to said memory cell block;

connecting means for simultaneously connecting each column of said memory cell block to said data transmitting line, said connecting means having groups of connector elements, each connector element corresponding to a column and each group of connector elements corresponding to a group of columns; and means responsive to an externally applied column group designating signal, a signal designating the flash write mode of operation and a write designating signal for selectively setting said groups of connector elements conductive or non-conductive, said column group designating signal designating a group of connector elements which is to be made non-conductive.

4. A semiconductor memory device according to claim 3, wherein said means for selecting setting comprises means responsive to said write designating signal for setting all of said connector elements conductive when said flash write designating signal is inactive, while neglecting the received column group designating signal.

5. A semiconductor memory device according to claim 3, wherein said means for selectively setting comprises means responsive to an externally applied column address for generating said column group designating signal.

6. A multiport RAM having a random access port and a serial access port, and a flash write function for writing data simultaneously to memory cells of a selected row from said random access port, comprising:

a plurality of memory cell blocks each having a plurality of memory cells arranged in a matrix of rows and columns;

row selecting means responsive to an externally applied row address signal for selecting one row of memory cells from each of said memory cell blocks;

column selecting means responsive to an externally applied column address signal for selecting at least one column of memory cells from each said memory cell blocks, said column selecting means adapted to set all columns in at least one block to selected state in response to a signal designating said flash writing;

a plurality of write data transmitting lines providing corresponding to each of said plurality of memory cell blocks;

means provided corresponding to each of said memory cell blocks for connecting the column selected by said column selecting means to a corresponding write data transmitting line, each said connecting means including connector elements provided corresponding to each column of an associated cell block and divided into groups by a plurality of columns; and means responsive to a flash write designating signal, a mask position designating signal and a write designating signal for controlling operation of said connecting means such that said connector elements are turned on or off group by group, said mask position designating signal designating memories to be masked by said group by group.

7. A multiport RAM according to claim 6, wherein said controlling means comprises means responsive to said column address for generating said mask position designating signal.

8. A multiport RAM according to claim 6, wherein said controlling means comprises means responsive to inactive state of said flash write designating signal and to active state of the write designating signal for making conductive all said connector elements.

9. A method of operating a semiconductor memory device having a memory cell array including a plurality of memory cells arranged in a matrix of rows and columns, each memory cell accessible at random sequence, and said memory cell array divided into groups of columns, comprising the steps of:

selecting a row of said memory cell array in response to an externally applied row address;

generating a mask group designating signal in response to a received address; and writing, in response to a flash write designating signal, the same data to all the memory cells of said selected row except the memory cells in a group of columns designated by said mask group designating signal.

10. A method according to claim 9, further comprising the step of generating said mask position designating signal in response to an externally applied column address.

11. In a semiconductor memory device including a memory cell block having a plurality of memory cells arranged in a matrix of rows and columns and a write data transmitting line, said memory cell block accessible at random sequence and columns of said plurality of memory cells divided into groups, each including a plurality of columns, a method of writing data comprising the steps of:

selecting a row of said memory cell block in response to an external row address; and connecting, in response to a flash write designating signal and an external mask column group designating signal, all the columns, except columns in a group designated by said mask column group designating signal, to said write data transmitting line for transferring the same data to all the columns.

12. A method according to claim 11, further comprising the step of generating said column group designating signal in response to an external column address.

13. In a semiconductor memory device including a plurality of memory blocks each having a plurality of memory cells arranged in rows and columns, a RAM port accessing to said memory block at random sequence and a serial port addressing said memory block at serial sequence, each of said memory block being divided into groups such that each group includes a plurality of columns, a method of writing data comprising the steps of:

selecting a row from each of said memory blocks comprising the steps of:

selecting a row from each of said memory blocks in response to an external row address; and responsive to a flash write designating signal and a mask column group designating signal, writing simultaneously, write data transmitted from said RAM port to all the columns in each of said memory blocks except columns of a group designated by said mask column group designating signal; whereby the same data are simultaneously written to memory cells connected to the selected row, except the columns of a group, designated by said mask column group designating signal, in each cell block.

14. A method according to claim 13, further comprising the step of:

generating said mask column group designating signal in response to an externally applied column address signal.

15. In a semiconductor memory device including a plurality of memory cells arranged in a matrix of rows and columns, a method of writing data comprising the steps of:

selecting a row of memory cells in which data is to be written;

designating a group of columns in which data writing is to be prohibited, the number of said designated columns being at least one and less than the total number of columns in the matrix;

simultaneously writing data representing a selected logic level to all the memory cells of the non designated columns in the selected row.

16. A semiconductor memory device comprising:

a memory cell array including a plurality of memory cells arranged in a matrix of rows and columns;

row selecting means responsive to an externally applied row address for selecting a row of said memory cell array;

column selecting means responsive to a column designating signal for selecting at least one column of said memory cell array;

means for designating a flash writing mode in response to the presence of a flash write designating signal and for designating a normal writing mode in response to the absence of said flash write designating signal;

means for simultaneously writing the same data to all the memory cells of columns not selected by said column selecting means in a row selected by said row selecting means during operation in said flash writing mode.

* * * * *